United States Patent [19]

Suzuki et al.

[11] 4,203,064
[45] May 13, 1980

[54] METHOD FOR AUTOMATICALLY CONTROLLING THE POSITION OF SMALL OBJECTS

[75] Inventors: Etsuji Suzuki; Tomio Kashihara; Susumu Hashimoto, all of Yokohama; Ken Watanabe, Kawasaki; Tsuyoshi Kodama, Katano, all of Japan

[73] Assignee: Tokyo Shibaura Electric Co., Ltd., Japan

[21] Appl. No.: 784,778

[22] Filed: Apr. 5, 1977

[30] Foreign Application Priority Data

Apr. 6, 1977 [JP] Japan .................................. 52-50352

[51] Int. Cl.² .............................................. G05B 1/06
[52] U.S. Cl. ................................... 318/640; 318/561; 250/561
[58] Field of Search ............... 318/640, 574, 577, 561; 250/561

[56] References Cited

U.S. PATENT DOCUMENTS

| | | | |
|---|---|---|---|
| 3,466,514 | 9/1969 | Brunner et al. | 318/640 |
| 3,555,252 | 1/1971 | Garden | 318/561 |
| 3,739,247 | 6/1973 | Yamaguchi et al. | 318/640 |
| 3,955,072 | 5/1976 | Johannsmeier et al. | 250/561 |
| 4,059,787 | 11/1977 | Aimar et al. | 318/640 |

OTHER PUBLICATIONS

Khoury, "2-D Area Array Solid-State Feedback Automatic Wafer Alignment System," Mar. 1975, *IBM Technical Disclosure Bulletin*, vol. 17, No. 10, pp. 2890-2892.

*Primary Examiner*—B. Dobeck
*Assistant Examiner*—Eugene S. Indyk
*Attorney, Agent, or Firm*—Finnegan, Henderson, Farabow, Garrett & Dunner

[57] ABSTRACT

A method for automatically controlling the position of small objects, comprises the steps of moving the object to cause at least a portion of an optical image of the object to be imaged on a photoelectric array which is placed on an image formation plane; sequentially detecting outputs by scanning photoelectric converting elements constituting the photoelectric array; counting, in a digital fashion, the position data of the object based on the above-mentioned outputs to deliver a correction signal for moving the object to a predetermined position; moving the object to a predetermined position according to the correction signal; and checking the position of the object by detecting outputs of respective photoelectric converting elements after completion of the above-mentioned movement step and calculating the positional data of the object.

2 Claims, 16 Drawing Figures

METHOD FOR AUTOMATICALLY CONTROLLING THE POSITION OF SMALL OBJECTS

BACKGROUND OF THE INVENTION

The present invention relates to an automatic position control method for positioning a small object, for example, a pellet used when a semiconductor element is manufactured.

When manufacturing semiconductor elements such as transistors or integrated circuits, it is necessary to position a very small part accurately at a predetermined position. Such a case is, for example, the positioning operation in the die mount or wire bounding process. The prior method for such positioning is involves moving the small object manually by using a microscope. This conventional method, however, is problematic in that the positioning operation is complex and inefficient and requires a highly skilled technique. Attempt has been made to automatise that positioning operation of the conventional method, with an unsatisfactory result from difficult problems of technique. The television camera, for example, is often used as a position detector for automatic positioning. However, this method by the television camera suffers from many problems. For example, since current must constantly flow through the rustor coil the heat evolved from the coil possibly deforms the components and causes the aging change of the optical axis. Since an analogue signal is used for detecting the position of the small object to be controlled, the positioning operation is sensitive to external noise and the detected value tends to be drifted and the circuit for the conversion of the analogue into a digital signal becomes complicated and expensive. The residual image of the camera tube inevitably elongates the cycle time necessary for the position detection, resulting in inefficiency of the work.

There is known a method for using a magnified projection image of a small object so as to detect the position of an object for positioning. In this method an object to be controlled is projected onto a screen to form a magnified image of the object thereon. Solar batteries are disposed on the screen. The positions of the edges of the projected image are detected in an analogue fashion through the solar batteries' outputs. The object is moved so that the outputs of the solar batteries have respectively a predetermined value. This projection image method, however, fails to accurately position the object due to the fact that the side surfaces of the object are generally not normal to the upper and lower surfaces, the periphery of the object is relatively uneven in contour and the light reflection from the edge of the objects has a complicated nature. Further, even if the object has minor cutaway portions on the periphery providing in fact no problem, such defects are detected and in consequence, the positioning of it is inaccurate. Moreover, since the position detector by the magnified projection image uses the analogue signal obtained from the solar batteries, in addition to the above-mentioned problems of drift and noise, it is further defective in that, if dust or the like adheres to the vinyl sheet on which the semiconductor pellet is mounted as found in the die mount process of semiconductor manufacturing, the output of the solar batteries is reduced, resulting an inaccurate detection of the edge positions of the object.

SUMMARY OF THE INVENTION

An object of the present invention is to provide an automatic position control method for small objects by which a small object may automatically be positioned accurately, and the positioning operation of the object is thermally and electrically stable without any affect from exterior.

To achieve the above object of the present invention, there is provided an automatic position control method comprising (a) a preliminary step for causing at least a portion of an optical image of an object to be imaged on a photoelectric array, comprised of a plurality of regularly arranged photoelectric converting elements, to permit the corresponding elements to be illuminated, the array being positioned on a image formation plane on which the optical image of the object is formed; (b) a detection step for sequentially detecting outputs from these elements by scanning the respective photoelectric converting elements; (c) a digital data processing step for calculating the position data of the object from the output data of the photoelectric converting elements as obtained at the detection step (b) to deliver a correction signal for moving the object to a predetermined position based on the position data; (d) a movement step for moving the object to said predetermined position upon receipt of said correction signal; and (3) a check step for checking the position of the object by digitally computing those outputs of the elements after the completion of said movement step (d) to obtain a position data of the object.

According to this method, as the detection of the object position, current the position data of the object based on the position data, and the delivery of a position correction signal based on this data are all effected digitally in the above-mentioned data processing step (c), for example, through the use of a microcomputer, the above-mentioned various data processing steps are carried out without any influence from outward.

If a space between the adjacent photoelectric converting elements is made small, for example, of the order of 10 microns and if each photoelectric array is scanned rapidly, for example, on the order of MHz, the position of the object can be automatically and very rapidly controlled.

In a first preferred embodiment of this invention a plurality of photoelectric converting elements are arranged in a row/column matrix array with the elements in a row direction arranged orthogonal to the elements in a column direction. In the detection step, these elements are sequentially scanned in one direction (for example, the row direction) and then in the other direction (in the column direction) to obtain corresponding outputs. The next digital data processing step calculates a sum of the number of nonilluminated columns, on which no optical image is overlapped, and the number of special columns, each having photoelectric elements illuminated or overlapped by the optical image, the number of said elements not exceeding a preset value, as both counted from one side of each column of the matrix array toward the optical image, and delivers a correction signal for moving the object in the row direction so as for said sum to become a predetermined value and a correction signal for moving the object in the column direction in the same way as in the row direction. In the next movement step the object is moved based on both correction signals. By so doing not only can the above-mentioned advantages be obtained, but even when a predetermined cutout portion is present on the outer periphery of the object, a position control can be effected as in the case of an object free from such a cutout portion.

The above-mentioned digital data processing step can also calculate the rotational position of the object from a later-described space and the number of nonilluminated photoelectric converting elements occurring on either one side of any selected two rows or columns parallelly extending with the above-mentioned space left therebetween to deliver a correction signal for rotating the object to a predetermined rotational position. In this case, the direction of the object can be corrected.

In a second preferred embodiment of this invention two linear photoelectric arrays and two image formation planes are provided, one array on one of the image formation planes corresponding to one direction on the object and the other array on the other image formation plane corresponding to another direction on the object which intersects at a right angle to said one direction. In the detection step the outputs of the respective photoelectric converting elements in each photoelectric array are sequentially detected by sequentially scanning the respective photoelectric array and based on the detection output data the position of the object can be automatically controlled in said two directions.

In a third preferred embodiment of this invention first and second linear photoelectric arrays are arranged as above described second preferred embodiment. An additional one linear photoelectric array (third array) is arranged in parallel with one of said first and second linear photoelectric arrays, for example, the second photoelectric array, with a space left therebetween. In the detection step the outputs of the respective photoelectric converting elements in each photoelectric array are detected by sequentially scanning the above-mentioned three photoelectric arrays. The next digital data processing step delivers based on the detection output data of the first and second linear photoelectric arrays a correction signal for moving the object in said two directions, and based on the detection output data of the second and third linear photoelectric arrays a correction signal relating to the rotational position of the object. By using the above-mentioned three linear photoelectric arrays, not only it is possible to effect such a position control as effected in the second preferred embodiment of this invention, but also it is possible to effect a rotational position control of the object. In this method it is possible to obtain the same function as obtained in the first preferred embodiment of this invention.

The second and third preferred embodiments permit a great reduction in the number of photoelectric converting elements used in the detection step, simplification of the associated scanning circuit and computation circuit, shortening of the time required in the detection step and digital data processing step, and lowering of manufacturing costs.

Other features and objects of the present invention will be apparent from the following description taken in connection with the accompanying drawings, in which:

DETAILED DESCRIPTION OF THE PREFERRED EMBODIMENTS

Figure 1:
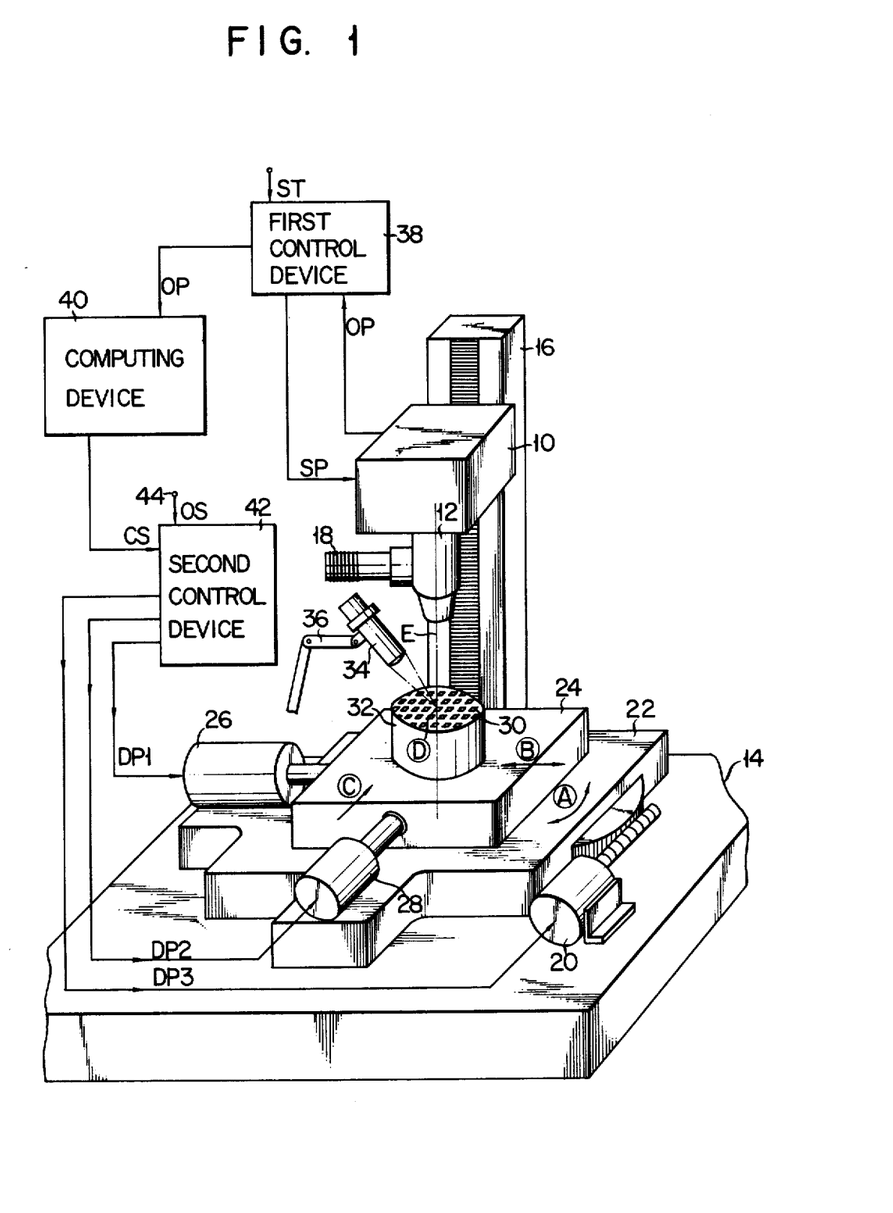
FIG. 1 shows a perspective view of a semiconductor pellet positioning apparatus according to the present invention, partly with a block diagram of a control system thereof.

Referring now to FIG. 1, there is shown a schematic drawing of a semiconductor pellet positioning apparatus to be used in die mount process of the semiconductor element manufacturing. In the figure, reference numeral 10 is a detector including photoelectric converting elements to be described later, with an optical system 12 projecting downwardly from the bottom surface of the detector. Detector 10 vertically slidably engages with a column 16 mounted on a foundation 14 of the detector 10. Light beams from a light source 18 are guided into the optical system 12.

On the foundation 14, a rotatable table 22 is provided, rotatable in the directions of arrow A with respect to an optical axis E of the optical system 12, through the drive of a pulse motor 20 mounted on the foundation 14. On the rotatable table 22, an X-Y table 24 is further provided which is rectilinearly movable reciprocally in the directions of X, i.e. a first direction (as indicated by the arrow B) and of Y, i.e. a second direction (as indicated by the arrow C) by the drive of an X-axis drive pulse motor 26 and a Y-axis drive motor 28, respectively, but being mounted on the rotatable table 22.

The X-Y table 24 is provided thereon with a transparent sheet 32 on which a plurality of semiconductor pellets 30 are arranged in proper spaces. A light source 34 fixed on one end of a foldable support arm 36 whose other end is fixed on the foundation 14, is used to form a light spot on the cross point D of the optical axis E of the optical system 12 to the surface of the transparent sheet 32 having the pellet 30 thereon, the light spot being smaller in diameter than each pellet.

A detector control device, i.e. a first control device 38 scans the respective photoelectric converting elements included in the detector 10, and transfers the output of the photoelectric converting elements to the digital computing device 40. More particularly, in the detector control device 38, the scanning pulse SP produced by using, for example, a ring counter, a shift register, etc. is successively fed to the detector 10, and the response pulse OP, i.e. the detected output, of the detector 10 is transferred to the computing device 40. The computing device 40 provided with electronic devices such as minicomputers, microcomputers, etc. computes the detected output to produce adequate informations concerning the position of an object to be controlled, i.e. the pellet 30. The position correcting signal CS produced from the position information is transferred to the motor control device, i.e. the second control device 42. Upon receipt of the position correction signal CS and the instruction signal OS received at a terminal 44, the motor control device 42 applies a first, second and third drive pulses DP1, DP2 and DP3 for forward and reverse rotation to an X-axis pulse motor 26, a Y-axis pulse motor 28 and a pulse motor 20 for the rotatable table 22.

Figures 2, 3, 4:
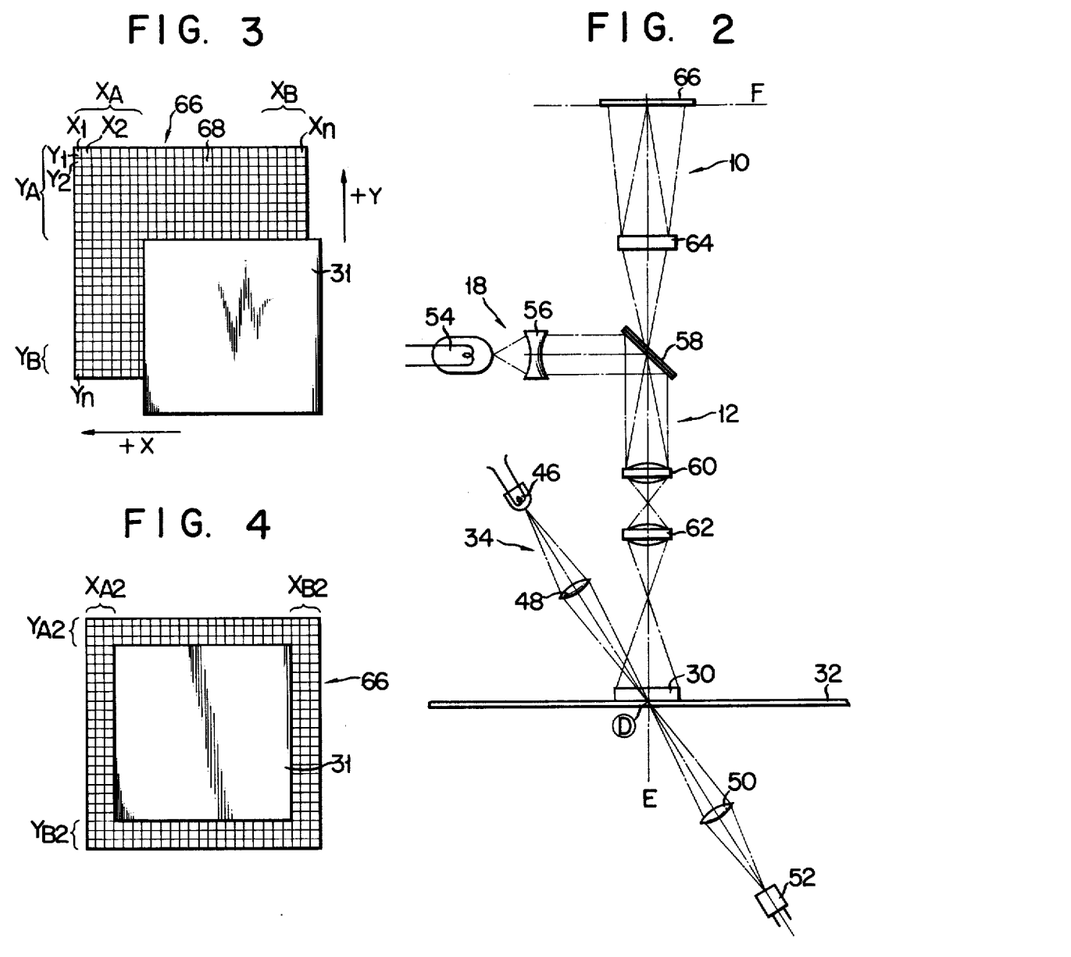
FIG. 2 is a schematic side view of an optical system for the semiconductor positioning apparatus of FIG. 1.
FIG. 3 illustrates the relationship of photoelectric array in matrix to an image before it is positioned.
FIG. 4 illustrates the position of the image after the first positioning of it.

Turning now to FIG. 2, there is shown an optical system used in the apparatus of FIG. 1. The light emitted from the lamp 46 of the light source 34 is projected onto the transparent sheet 32 through a condensing lens 48 to form a light spot on the point D. The light passed through the transparent sheet 32 is projected onto a photodiode 52. Accordingly, if the pellet 30 is positioned at the point D, the incident light to the photodiode 52 is shut off.

The light rays orginated from a lamp 54 of the light source 18 are parallelized by means of a lens 56 and reflected by a semitransparent mirror 58 to be directed downwardly, and then irradiates the pellet 30 through a pair of objective lenses 60 and 62. The pellet 30 is imaged on an image formation surface F through a pair of objective lenses 62 and 60, the semitransparent mirror 58 and an image formation lens 64. A photoelectric array 66 is arranged on the image formation surface F. The photoelectric array 66 is composed of a number of minute photoelectric converting elements regularly arranged. More particularly, as indicated by characters $x_1$ to $x_n$ and $y_1$ to $y_n$ in FIG. 3, a number of photoelectric converting elements arranged in X- and Y-directions in a matrix fashion with n columns and n rows. The respective photoelectric converting elements 68 of the array 66 are successively scanned by the scanning pulse SP (see FIG. 1) fed from the detector control device 38 for detecting the outputs of those photoelectric converting elements.

The operation of thus constructed apparatus will be given below with reference to FIGS. 3 to 9.

A command signal OS for preparatory movement is first applied to the terminal 44 of the motor control device 42. In response to the command signal OS, the control device delivers first and second drive pulses DP1 and DP2 to the X-axis drive pulse motor 26 and Y-axis drive pulse motor 28 which in turn cause the X-Y table 24 to move in X-direction and Y-direction. With such a movement of the X-Y table, one of pellets 30 placed on the table 24 reaches the point D. At this time, the light from the light source 34 is shut off so that the output of the photodiode 52 disappears. Upon the change of the output of the photodiode 52, the command signal OS having been given to the motor control device 42 is removed so that the movement of the X-Y table 24 ceases, thereby completing the preparatory movement of the table. Following this preparatory operation, the positioning operation of the pellet 30 commences. By means of a feeding mechanism (not shown), the pellet 30 is fed to the semiconductor pellet positioning apparatus in a manner that the respective edges of the pallet 30 are aligned substantially in parallel with the X- and Y-directions. Therefore, the image 31 of the pellet 30 is aligned at its edges substantially in parallel with the edges of the photoelectric array 66 and stops while having a portion which covers the center of the array 66.

Figure 5:
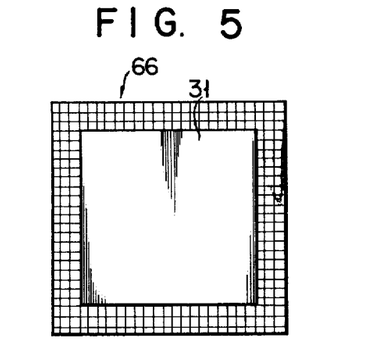
FIG. 5 illustrates the relationship of the photoelectric array to the image after it is positioned.

Explanation to be given is the operation for positioning the pellet 30. The pellet 30 is illuminated by the light rays originated from the light source 18 (FIG. 2), and the image 31 of the pellet 30 is formed onto the image formation surface F. In this example, the image 31 of the pellet 30 is finally positioned on the photoelectric array 66 with such an arrangement that the edges of the image 31 are aligned in parallel with the photoelectric array 66 having a periphery with a uniform width, as shown in FIG. 5. It is as a matter of course that the width of the periphery of the array 66 may be adjusted to have a desired value, through a corresponding adjustment of the computing device 40 (FIG. 1). In the case of FIG. 5, the image 31 is formed on the photoelectric connecting elements other than those on three columns and rows on the periphery.

Figure 9:
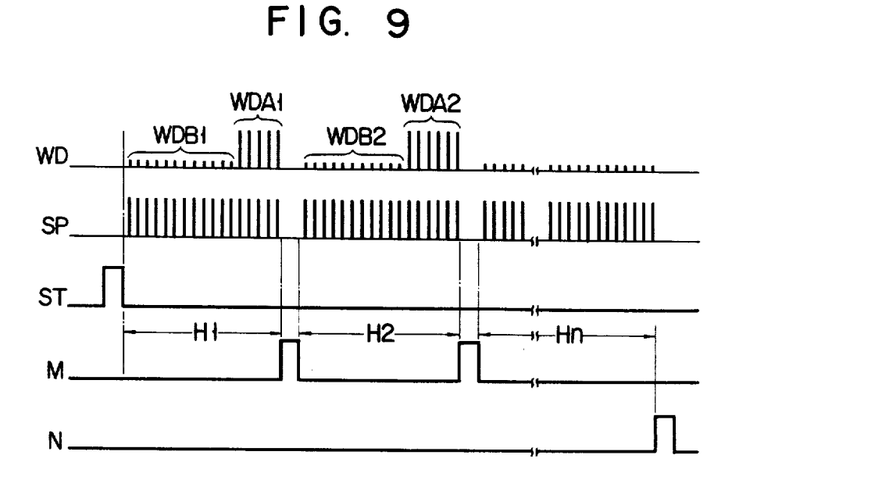
FIG. 9 is a timing diagram illustrating the relationship of scanning pulses to be applied to a detector to the output of the detector.

FIG. 9 shows the sequence of the positioning control of the pellet 30. After completion of the preparatory operation of movement, the signal generated by the photodiode 52 in FIG. 2 provides a scanning initiating signal $S_T$ which is applied to the detector control device 38 (FIG. 1). Upon receipt of the signal ST, the detector control device 38 delivers scanning pulses, i.e. clock pulses SP, which also in turn are successively applied, one by one, to the photoelectric converting elements 68 of the photoelectric array 66. More particularly, the scanning pulses SP are applied to the photoelectric converting elements on the uppermost row $y_1$ from left to right, and then those on the next row $y_2$ just below the above $y_1$ from left to right. This scanning operation will be repeated till the nth row of the photoelectric converting elements.

As a result of the scanning, the respective photoelectric converting elements 68 produce at their output terminals output WD. In FIG. 9, the horizontal axis is a time axis, and the detected outputs $WDA_1$, $WDA_2$, ... in those WD are indicative of those from the photoelectric converting elements 68 located on the area over which the image 31 is formed and each is the logical or binary digit "1". The detected outputs $WDB_1$, $WDB_2$, ... are those of the photoelectric converting elements 68 in respective rows on the area over which no image 31 is formed and each is the logical or binary digit "0". The character M designates the signal indicating the completion of the row scanning, and the character N the signal indicating the completion of one frame scanning and generated when all of the photoelectric converting elements are scanned. Characters $H_1$, $H_2$ ... $H_n$ indicate the scanning period of each row.

A train of the detected outputs WD is outputted as response pulses to the detector control device 38 and then fed to the computing device 40. In the computing device 40, counted is the numbers of the logical "1" signals included in each row $y_1$ to $Y_n$ in the first picture frame, namely the number of the signals $WDA_1$, WDA$_2$, ... WDA$_n$ in each period H$_1$, H$_2$ ... H$_n$. Through the counting operation, obtained are the total number Y$_A$ of the y$_1$ row and some successive rows following the y$_1$ and the total number of the y$_n$ row and some rows successively arranged followed by y$_n$ (see FIG. 3), each of those rows y$_1$ to y$_n$ having the number of logical signal "1" included therein below a predetermined one, for example, below 20% of the numbers of photoelectric converting elements n arranged in each row. Further, obtained are the total numbers X$_A$ of the x$_1$ column and some columns successively following the x$_1$ column, and the total number X$_B$ of the x$_n$ column and some columns successively arranged proceeding to the column x$_n$, each of those columns x$_1$ to x$_n$ having the number of logical signal "1" included therein below a predetermined one, for example, below 20% of the number of photoelectric converting elements n arranged in each column (FIG. 3).

The positioning of the pellet 30 is performed in the X and Y directions by using those total numbers X$_A$, X$_B$, Y$_A$ and Y$_B$. In the pellet positioning of the X direction, the X$_A$ is used if it has a value, i.e. no logical "0", and the X$_B$ is used if the X$_A$ has no value, i.e. it has the logical "0". In this case, however, it is assumed that the photoelectric array 66 and the image 31 are related in size so that either X$_A$ or X$_B$ has the value. This is true in the total numbers Y$_A$ and Y$_B$.

Let consider now the case where the X$_A$ and Y$_A$ have the values, respectively, as shown in FIG. 3. The X$_B$ and Y$_B$ have the logical "0" in the case of the figure; however, those are illustrated for indicating the locations necessary when the X$_B$ and Y$_B$ are counted. First of all, the X-Y table 24 is driven and with the movement of the table 24, the image 31 is moved by the amount defined by X$_A$−x$_o$ and Y$_A$−y$_o$ in the direction defined by the signs of the differences of them. The positive directions of the image 31 are as shown by the arrows +X and +Y in FIG. 3A. Note here that the x$_o$ and y$_o$ represent the values of the X$_A$ and Y$_A$ when the image 31 is moved to be positioned at the proper location of the photoelectric array 66. In the figure, those values are each set 3. The operation thus completes the first positioning of the pellet 30. Again, the calculation of X$_{A2}$, X$_{B2}$, Y$_{A2}$ and Y$_{B2}$ corresponding to X$_A$, X$_B$, Y$_A$ and Y$_B$ is performed. The following calculation will then be carried out to check if a desired positioning is made or if the size of the pellet 30 falls within a predetermined one.

$$DC_1 \leq X_{A2} \cap X_{B2} \leq DC_2 \quad (1)$$

$$DC_3 \leq Y_{A2} \cap Y_{B2} \leq DC_4 \quad (2)$$

where DC1 to DC4 are predetermined constants. If those equations (1) and (2) are satisfied, the positioning of the pellet 30 is completed.

On the other hand, if those equations are not satisfied, the second positioning operation must be made, in which the calculations of (X$_{A2}$−X$_{B2}$)/2 and (Y$_{A2}$−Y$_{B2}$)/2 is executed, and then the X-Y table 24 is moved in order that the image 31 is moved by the amount of those calculation results in the directions of the signs of them. This causes the image 31 to be positioned substantially at the center 31 of the photoelectric array 66, as shown in FIG. 5.

Although the positioning process mentioned above relates to the case where the X$_A$ and Y$_A$ have the values, respectively, the similar process will also be applied to the case of X$_B$ and Y$_B$ having the values.

Figure 6:
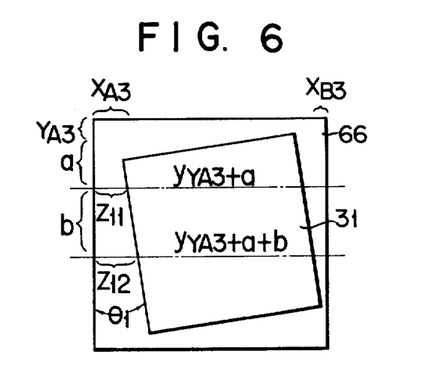
FIG. 6 illustrates the case where the image is slanted with respect to the photoelectric array.
Figure 7:
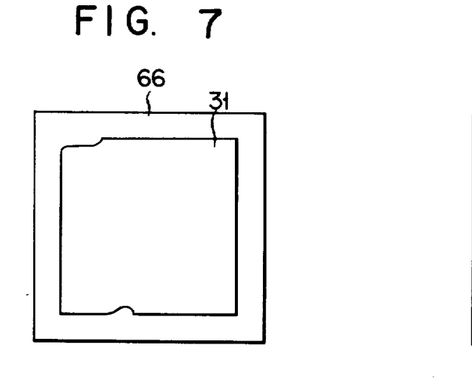
FIGS. 7 and 8 illustrate the case where pellet with small cut-away portions and with a large cut-away portion are positioned, respectively.

The positioning operation mentioned above have also been referred to the case where the image 31 of the pellet 30 is related to the photoelectric array 66 so that their respective edges corresponding to each other are disposed in parallel. Another case where the pellet 30 is greatly shifted in the rotational direction, requires a rotation correction of positioning to be described below. Before execution of the second positioning, calculated values of X$_{A3}$, X$_{B3}$, Y$_{A3}$ and Y$_{B3}$ corresponding to the above-mentioned X$_A$, X$_B$, Y$_A$ and Y$_B$, as shown in FIG. 6. When, depending on those results of calculations, the pellet 30, and accordingly the image 31, is corrected in the rotational direction, the correcting operation is realized by using one of the following two equations according to the shift condition of the pellet 30.

$$X_{A3} \geq X_{B3} \quad (3)$$

$$X_{A3} \geq X_{B3} \quad (4)$$

When using the equation (3), calculation is made of the number of the logical "0" signals Z11 and Z12 of the rows y$_{YA3+a}$ and y$_{YA3+a+b}$ on the x$_1$ column side. In this case, y$_{YA3+a}$ means the YA3+ath row and y$_{YA3+a+b}$ means the YA+a+bth row where a and b are values properly selected along the column of the photoelectric array 66. Putting those factors into the following equation (5) leads to the rotational angle $\theta_1$ to be corrected. In FIG. 6, the vertical and horizontal lines are omitted for the sake of clear illustration of the drawing, those lines showing the individual photoelectric converting elements. This is applicable to the drawings of FIGS. 7 and 8 and FIGS. 11 to 14.

$$\theta_1 = \tan^{-1}(Z11 - Z12)/b \quad (5)$$

When the equation (4) is used for the correcting operation of the pellet 30, Z$_{n1}$ and Z$_{n2}$ indicating the number of logical "0" included in the rows of y$_{YA3+a}$ and y$_{YA3+a+b}$ on the x$_n$ column side, are calculated and, by putting those factors into the following equation (6), the rotational angle $\theta_2$ to be corrected is obtained.

$$\theta_2 = -\tan^{-1}(Zn1 - Zn2)/b \quad (6)$$

In order to rotate the image 31 by the calculated angles $\theta_1$ and $\theta_2$, position correcting signals CS are issued from the computing device 42 so that the pulse motor 20 for the rotatable table 22 is driven to rotate the pellet 30 corresponding to the image 31. Such a rotation of the pellet 30 causes the pellet 30 to be shifted slightly in the X- and Y-directions. This slight shift of the pellet 30 is finally corrected through the further positioning operation mentioned above for the X- and Y-directions by using the data obtained from the ensuing several picture frames, and is positioned correctly at the location of FIG. 5.

Figure 8:
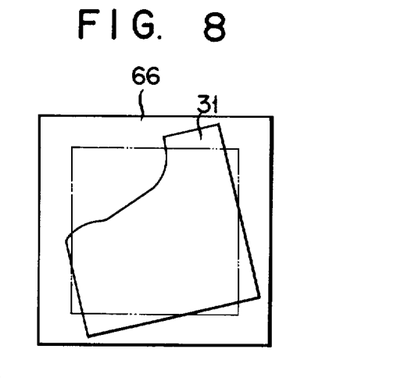

The positioning operations mentioned above of the pellet 30 enables the pellet to be correctly positioned, even if the pellet has some cut-away portions at the corners or the edges. The reason for this will be given later. If the cut-away portion of the pellet 30 is too large as shown in FIG. 8, such a pellet is positioned greatly shifted as shown in FIG. 8. In this case, the number of logical "0" signals is counted within a properly selected region of the photoelectric array 66, for example, the frame defined by an alternate long and two short dashed lines. And if the number of the logical "0" signals exceeds a predetermined value, it is determined that such a pellet is an inferior one. Thus the inferior pellet, partly broken or cracked, is detected at this stage. In the case previously described, in which electrically inferior pellets as in die mount process are marked, it is possible to form only the image of the mark put on the inferior pellet on the image forming surface F by slightly darkening the illumination of the light source 18. Accordingly, the number of logical "0" signals on the area within the alternate long and short dashed lines may be greatly increased, as compared with good pellets, thereby ensuring the detection of the inferior pellets.

Figure 10:
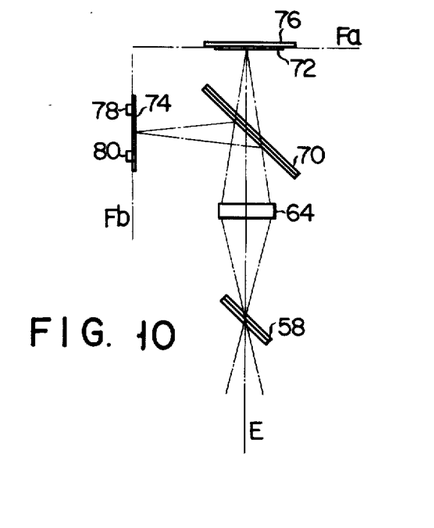
FIG. 10 is a schematic side view of the main part of another optical system.

A second embodiment of the present invention will be explained below. FIG. 10 shows a modified portion of an optical system employed in the present invention. In the optical system in FIG. 10, the portion below a semi-transparent mirror 58 is the same as that of the optical system in FIG. 2. As seen from the figure, a part of the light beams passing an image formation lens 64 straightly progress along the optical axis E and pass a semi-transparent mirror 70 to reach a first image formation surface Fa to form a first image 72 of the pellet 30 (FIG. 2). The remainder of the light rays is reflected rectangularly by the mirror 70 to form a second image 74 on a second image formation surface Fb disposed normal to the first image formation surface Fa. On the first image formation surface Fa, is provided a first linear photoelectric array 76 consisting of a number of photoelectric converting elements directly arranged at equal intervals in the B direction in FIG. 1. What is disposed on the second image formation surface Fb are second and third linear photoelectric arrays 78 and 80, each similar to the photoelectric array 76, in the Y-direction, i.e. in the C direction in FIG. 1, those arrays being equally spaced to each other.

The first linear photoelectric array 76 is used for detecting the position of the first image 72, i.e. that of the pellet 30 in the X-direction; the second linear photoelectric array 78 is used for detecting the position of the second image 74, i.e. that of the pellet 30 in the Y-direction; the third linear photoelectric array 80, in cooperation with the second linear photoelectric array 78, is used for detecting the angular position of the second image 74, i.e. the pellet 30.

Figure 11:
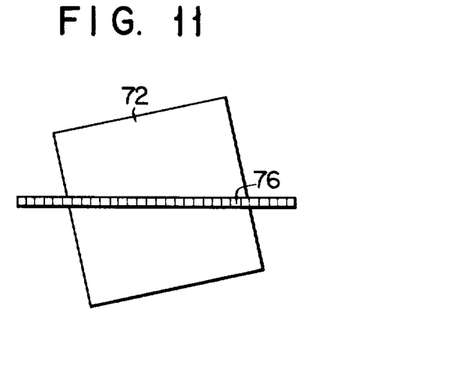
FIG. 11 shows the relationship of a first image to a first linear photoelectric array when the optical system of FIG. 10 is used.
Figure 12:
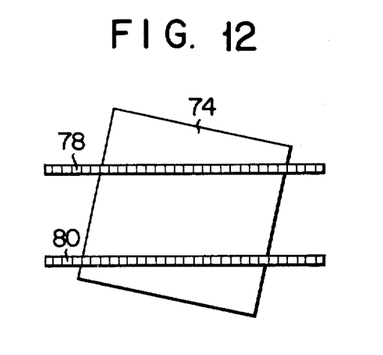
FIG. 12 shows the relationship of a second image to a second and a third linear photoelectric arrays in cooperation when the optical system of FIG. 10 is used.

With respect to the second embodiment of the present invention, an explanation will be made of the positioning operation of the pellet 30 when the image of the pellet is shifted in the X- and Y-directions and is rotated in the proper direction with respect to the first, second and third linear photoelectric arrays 76, 77 and 78. FIGS. 11 and 12 show the relationships of the first image 72 to the first linear photoelectric array 76, and of the second image 74 to the second and third linear photoelectric arrays 78 and 80. FIG. 11 is the view of the first image 72 as viewed from the top of the drawing of FIG. 10, and FIG. 12 is the view of the second image 74 as viewed from the left of FIG. 10. In those figures, the scanning is made from right to left in the drawing.

Figure 13:
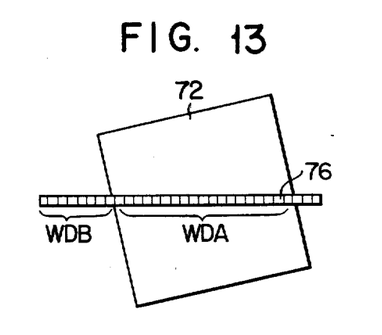
FIGS. 13 and 14 illustrate the operation for moving the first image to the center of the first linear photoelectric array.
Figure 14:
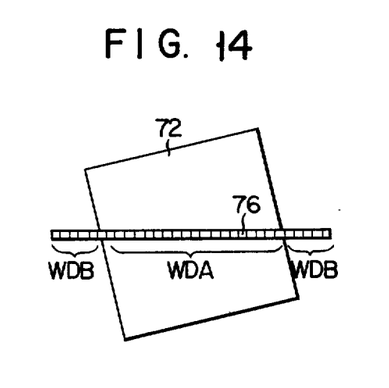
Figure 15:
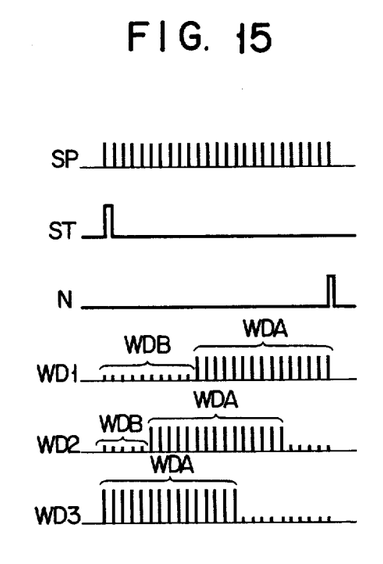
FIG. 15 is a timing diagram illustrating the operation of FIGS. 13 and 14.

When the first image 72 is shifted to the right with respect to the first linear photoelectric array 76 as shown in FIG. 13, detection is made of the number $N_B$ of logical "0" signals included in the detected output WDB from the photoelectric array portion projected to the left from the first image 72 and the number $N_A$ of the logical "1" signals included in the detected output WDA of the photoelectric array portion illuminated by the first image 72. Then, the X-Y table 24 is moved in the X-direction in order that the number of the "0" signals in the detected output WDB included in the first linear photoelectric array portion projected from the right side of the first image 72 is equal to that of another detected output WDB in the photoelectric array portion projected to the right from the left side of the first image 72. FIG. 15 shows a timing diagram illustrating the just-mentioned movement of the table 24. In the timing diagram, SP is scanning pulses, ST scanning initiation pulses, N scanning end pulses, and WD (WD1 to WD2) is detected outputs. The computing device 40 counts the numbers of the logical "1" and the logical "0" signals included in the detected output of WDB and WDA, through the counter in the computing device 40, and then Jx is computed by using the following equations $$J = \tfrac{1}{2}[N_B - \{n - (N_B + N_A)\}] \tag{7}$$

$$Jx = \rho J/\alpha$$

where n is number of the photoelectric converting elements included in the first linear photoelectric array 76, $\rho$ is distance between adjacent photoelectrical converting elements and $\alpha$ is the magnification of the optical system. Jx is the distance that the pellet 30 is moved in the X-direction until it reaches the position shown in FIG. 14. The computing device 40 delivers to the motor control device 42 the position correcting signal CS to move the X-Y table 24 by the distance Jx in the X-direction. The detected outputs WD1, WD2 and WD3 illustrate various conditions of the detected output pulses WD produced by the shift of the first image 72 to the first linear photoelectric array 76 in the X-direction.

The positioning of the Y-direction is performed by using the second linear photoelectric array 78 in a manner similar to that of the X-direction.

Figure 16:
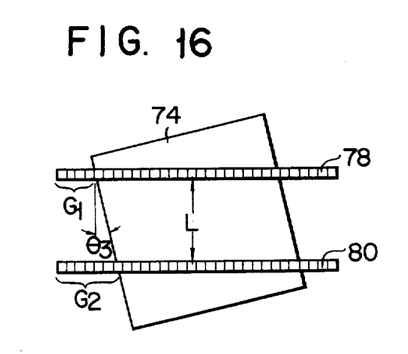
FIG. 16 illustrates the relationship of the second image to the second and third linear photoelectric arrays at the initial stage of the operation for correcting the deviation of the rotational direction of the image.

After completion of the positioning of the X- and Y-directions, if the second image 74 is slanted to the second and third linear photoelectric arrays 78 and 80, for example, as shown in FIG. 16, the slant is corrected by rotating the pellet 30 and thus the second image 74 through the drive of the rotatable table 22. The photoelectric arrays 78 and 80 are used for this correcting operation, and the computing device 40 computes the correcting angle $\theta_3$ that the table 24 is to be rotated, in accordance with the following equation (9)

$$\theta_3 = \tan^{-1}\rho(G1 - G2)/L \tag{9}$$

where $\rho$ is the distance between adjacent photoelectric converting elements, L is the distance between the photoelectric arrays 78 and 80, and G1 and G2 are the numbers of logical "0" outputs of the photoelectric converting elements on the respective photoelectric arrays 78 and 80 projected to the left from the left side of the second image 74. The rotation of the X-Y table 24 for correcting causes the X- and Y-directional position of the pellet 30 and the positions of both the images 72 and 74 to slightly be shifted. Therefore, the position errors in the X- and Y-directions are again corrected as in the previous case, and then the positioning operation of the pellet 30 is completed.

It should be understood that the present invention is applicable to the positioning operation of any other suitable small object than the semiconductor pellet which is employed in those embodiments mentioned above. Although, in the above-mentioned embodiments, the image of the pellet is centered in positioning on the photoelectric array, if the image is too large to be seated within the region of the photoelectric array, the pellet may be positioned by moving some of the edges of the pellet to a predetermined location of the photoelectric converting element. Further, if the pellet feeding mechanism requires no correction to the rotational direction of the pellet, the pellet positioning may be executed only by using the photoelectric arrays for correcting the X- and Y-directional positions.

As described above, the small object automatic position control method according to the present invention employs the photoelectric array of an aggregation of small square photoelectric elements (for example, of the order of 10μ) for position detecting. Therefore, said apparatus enables positioning of a small object and an object having irregular edges and cutaway portions on the periphery. The reason for this is that the calculation for positioning is made, with an assumption that logical "0" signal is assigned to the detected outputs WD having logical "1" signals less than a predetermined percentage, for example, 20%, of the number n of photoelectric converting elements in each direction of X and Y; logical "1" is assigned to the outputs WD having logical "1" signals in exess of that percentage. In other words, for example, if the pellet has convex portion on the edge producing the logical "1" level in number below that percentage, such a pellet is treated at the pellet having no convex portion. Further, in the case of the pellet having a slight cutaway portion on the continuous periphery, i.e. the portion producing the logical "0" signal, such a pellet is treated as that having continuous even edges. The program of the computing device 40 can be so properly adjusted that for the above-mentioned angles θ1, θ2 and θ3 below a predetermined value the X-Y table is not rotated and only when the angles Q1, Q2 and Q3 exceed the preset value the X-Y table is rotated. In this case, no rotational correction is given to a practically unnecessary small inclination of the pellet.

In comparing with an automatic position control apparatus for small objects by using a television camera, the following advantageous effects are attained according to the present invention. No change of an optical axis due to heat evolved is produced, unlike the case of television camera. No signal drift is produced and no adverse affect by noise is expected, because no analogue signal is used. No adverse affect by residual image is expected. Since no complex circuit for sampling the video signal is necessary, the video signal is not affected by the drift and noise. Unlike the television camera case, the scanning is made with respect to the X- and Y-directions so that the position errors in both the directions may easily be detected. Moreover, the position control apparatus of the present invention can detect the position of the pellet with a high resolution even when the pellet is illuminated by a weak light, and permits a satisfactorily wide range of adjustment of the scanning time, if necessary.

Further, in case where individual photoelectric arrays are disposed in the respective X- and Y-directions, as in the case of the second embodiment, the photoelectric arrays to be employed may be of the linear type as shown in FIGS. 11 and 12. Accordingly, the number of necessary photoelectric converting elements may greatly be reduced, as compared with the matrix type photoelectric array 66 shown in FIG. 3.

As described above, in the case of the first embodiment, the amount of the cutaway portion of the small object to be controlled may easily be detected so that, if the amount of the cutaway portion is compared with a predetermined reference amount, it is possible to check if the small object to be controlled is good or not.

In either case, the position of the small object can rapidly and very accurately detected by using photoelectric converting elements of the order of 10μ and scanning these elements by pulse signals of the order of, for example, 1 to 10 MHz. In consequence, the operation efficiency of the positioning device can be enhanced.

Various other modifications of the disclosed embodiment will become apparent to the person skilled in the art without departing from the spirit and scope of the present invention as defined by the appended claims.

What we claim is:

1. A method for automatically controlling the position of a small object comprising the steps of:
   (a) exposing at least a portion of said object to a light beam;
   (b) focusing the optical image created by the reflection of said light from said portion onto first and second separate image forming planes;
   (c) illuminating the elements corresponding to said image on first and second linear photoelectric arrays, one of said arrays being formed on each of said planes to detect the position of the object in two directions at right angles to one another;
   (d) sequentially scanning the elements of said first and second linear arrays to produce an output pulse from each element corresponding to the illuminated or non-illuminated state of each element;
   (e) sequentially detecting the output from each of said elements;
   (f) digitally computing the number of non-illuminated elements on each side of said optical image for each linear array from said outputs;
   (g) generating first and second correction signals to move said object in the direction of said first and second arrays, respectively, to a point where a predetermined number of non-illuminated elements appears on each side of said optical image for each linear array; and
   (h) moving said object to said point in response to said first and second correction signals.

2. The method of claim 1 wherein said illuminating step includes the step of illuminating the elements corresponding to said image on a third linear photoelectric array, parallel to and spaced apart from said second linear photoelectric array on said second separate image forming plane; said scanning step includes scanning the elements of said third linear array to produce an output pulse from each element corresponding to the illuminated or non-illuminated state of each element; said detecting step includes sequentially detecting the output from the elements of said third array; said computing step includes digitally computing the number of non-illuminated elements on the same side of the optical image for the second and third arrays from the output of said elements; said generating step includes generating a third correction signal to rotate the object to a predetermined rotational position; and said moving step includes rotating said object to said predetermined rotational position in response to said third correction signal.

* * * * *